(12) United States Patent
Wootton

(10) Patent No.: US 9,620,868 B2
(45) Date of Patent: Apr. 11, 2017

(54) COMPACT ELECTRICAL CONNECTION SYSTEM

(71) Applicant: Matthew Wootton, O'Fallon, MO (US)

(72) Inventor: Matthew Wootton, O'Fallon, MO (US)

( * ) Notice: Subject to any disclaimer, the term of this patent is extended or adjusted under 35 U.S.C. 154(b) by 95 days.

(21) Appl. No.: 14/524,003

(22) Filed: Oct. 27, 2014

(65) Prior Publication Data

US 2016/0118724 A1   Apr. 28, 2016

(51) Int. Cl.
  *H01R 4/22* (2006.01)
  *F21V 23/06* (2006.01)
  *H01R 4/12* (2006.01)
  *G01R 15/18* (2006.01)
  *H01R 43/00* (2006.01)
  *H01R 43/04* (2006.01)

(52) U.S. Cl.
  CPC ............. *H01R 4/22* (2013.01); *G01R 15/18* (2013.01); *H01R 4/12* (2013.01); *H01R 43/005* (2013.01); *H01R 43/04* (2013.01)

(58) Field of Classification Search
  CPC .... H01R 4/2433; H01R 13/506; H01R 11/12; H01R 13/6589; H01R 4/22; H01R 9/223; H01R 9/2416; F21V 23/06; F21V 21/002; F21V 23/002; F21V 27/00; F21S 4/10; Y10T 29/53209
  USPC ....................................................... 324/127
  See application file for complete search history.

(56) References Cited

U.S. PATENT DOCUMENTS

| | | | | |
|---|---|---|---|---|
| 5,151,239 A | * | 9/1992 | King, Jr. ................. | H01R 4/22 174/87 |
| 7,281,942 B2 | * | 10/2007 | Swedberg ............. | H01R 4/4836 439/441 |
| 2004/0104039 A1 | * | 6/2004 | Herbert King, Jr. .... | H01R 4/12 174/87 |
| 2008/0020626 A1 | * | 1/2008 | Scherer ................ | H01R 4/2433 439/402 |
| 2010/0295691 A1 | * | 11/2010 | King, Jr. ................. | H01R 4/22 340/635 |
| 2012/0203481 A1 | * | 8/2012 | Carpenter ............. | G01R 21/133 702/62 |

* cited by examiner

*Primary Examiner* — Son Le
*Assistant Examiner* — Akm Zakaria
(74) *Attorney, Agent, or Firm* — Polster, Lieder, Woodruff & Lucchesi, L.C.

(57) ABSTRACT

An electrical connection system (10) for connecting at least two electrical wires (W) together in a secure housing. A non-electrically conductive base (12) has a plurality of ports (16) corresponding to at least the number of wires being connected together with an end of each wire being inserted through a respective port. Exposed ends of the wires are then twisted together. A non-electrically conductive cap (14) is sized and shaped to align with and fit over a top of the base with the twisted together exposed ends of the wires fitting within the cap. The base and cap together form a shell in which the twisted together wires are securely enclosed.

18 Claims, 6 Drawing Sheets

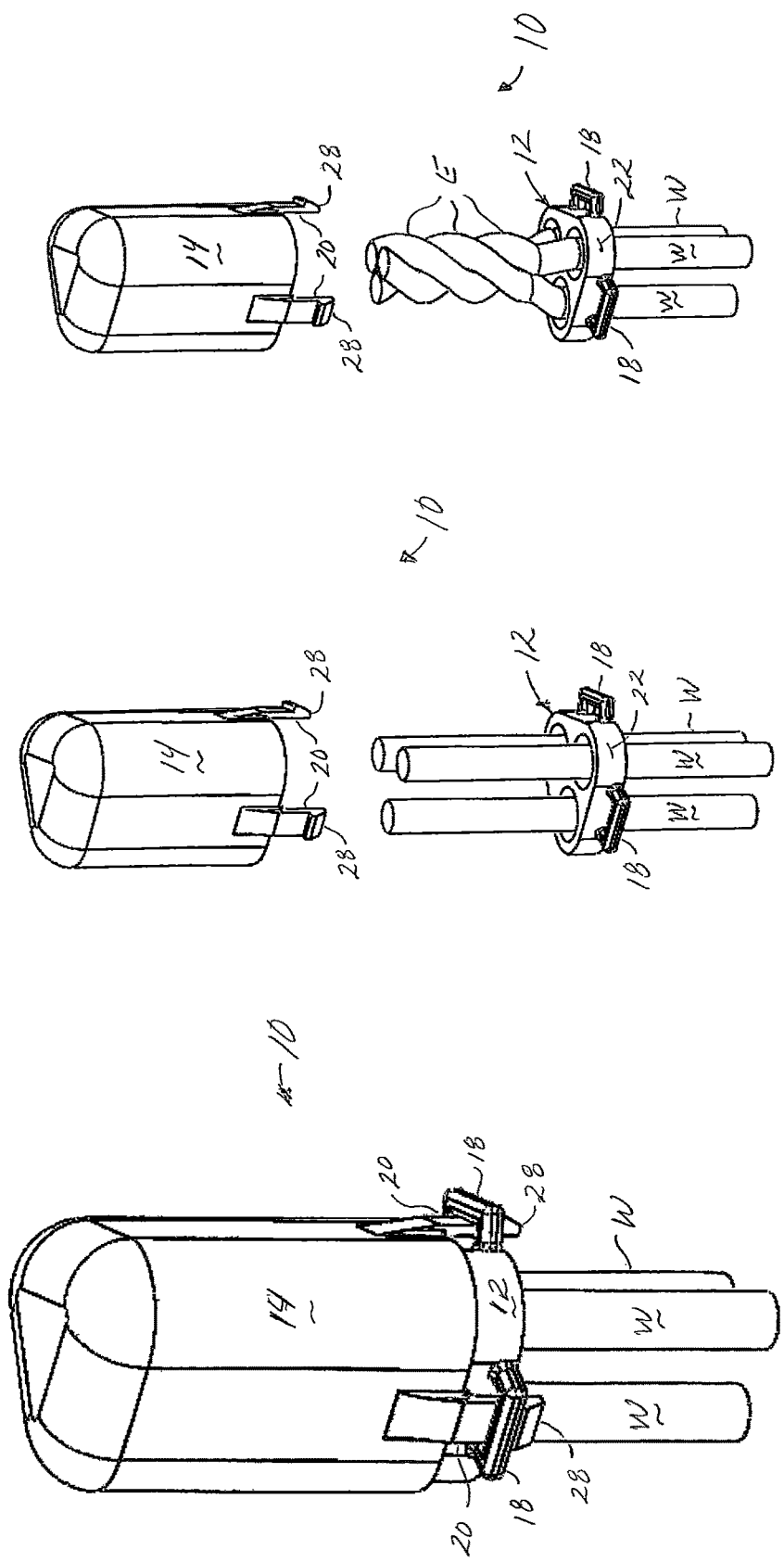

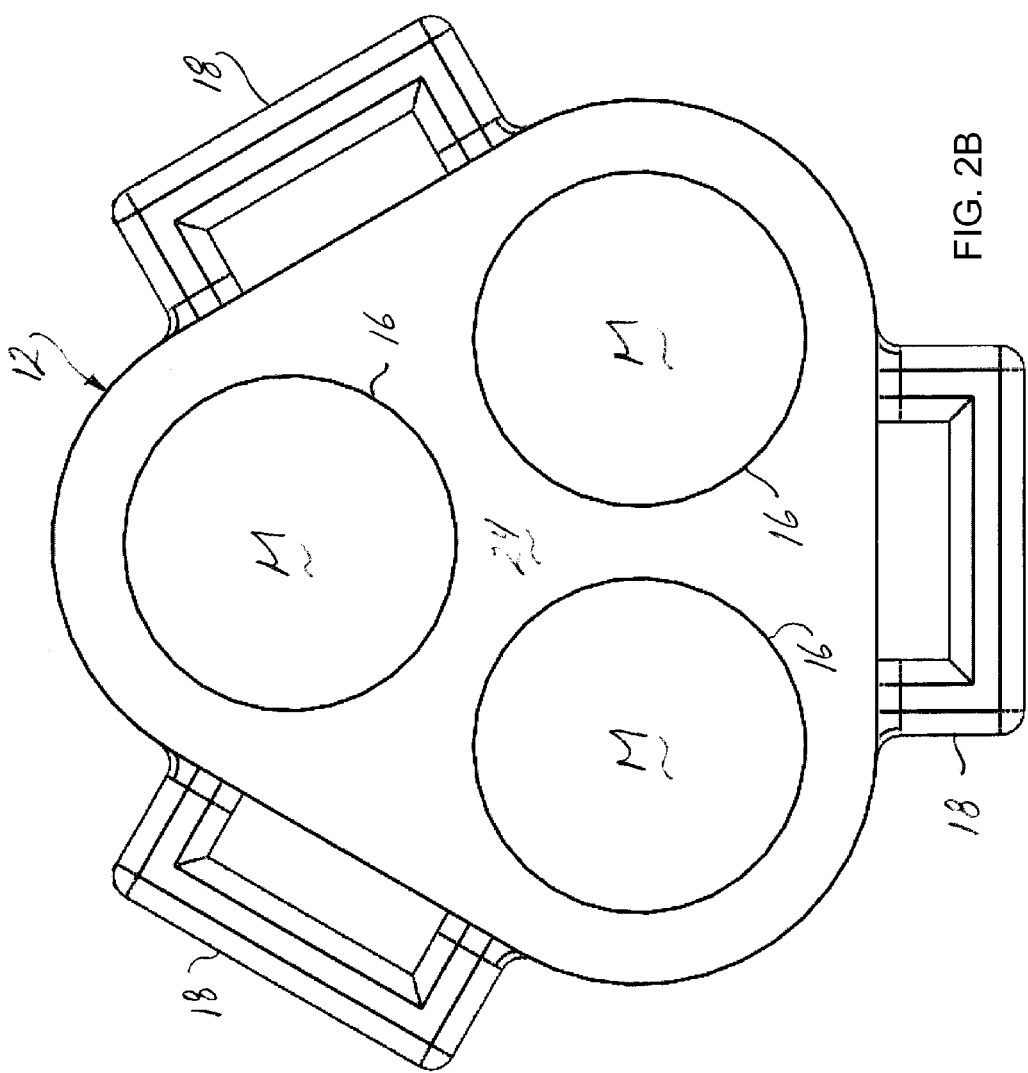

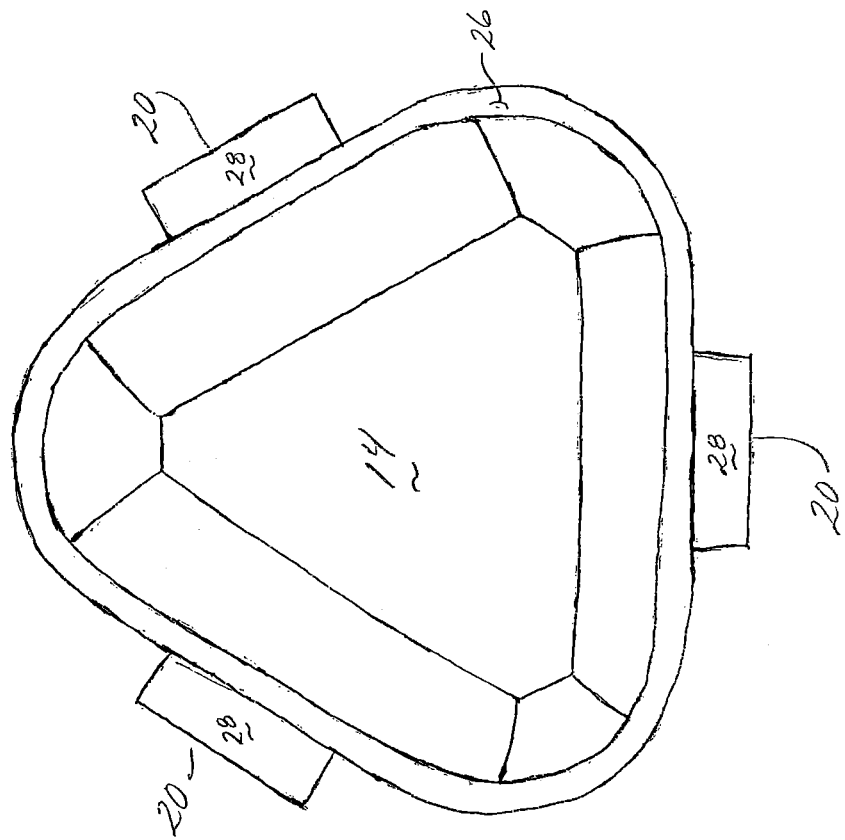
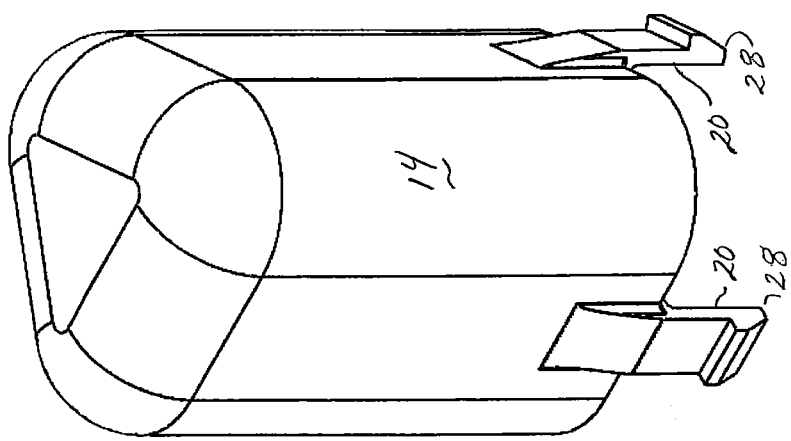
FIG. 4B
FIG. 4A

COMPACT ELECTRICAL CONNECTION SYSTEM

CROSS REFERENCE TO RELATED APPLICATIONS

None

STATEMENT REGARDING FEDERALLY SPONSORED RESEARCH OR DEVELOPMENT

N/A

BACKGROUND OF THE INVENTION

This invention relates to twist-on wire connectors used in electrical systems; and, more particularly to a compact electrical connection system for twisted wires and having an electrically insulating shell.

There is a continuing need to conveniently connect electrical wires together in an electrical system. The most common type connector, and the one extensively used by electrical contractors and do-it-yourselfers is the "twist-on connector." This connector is also commonly referred to as a wire nut, a cone connector, or a thimble connector.

The connector typically has an insulated plastic shell molded over a sharpened spring steel inner coil and is used to fasten together two or more electrical conductors. Regarding their use, electricians tend to prefer to twist electrical wires together and use an electrical tape to insulate the connection. This has the advantage of an electrician seeing that the wires are indeed twisted together and have achieved a good mechanical connection. Indeed, a practice used by many electricians who use a twist-on connector is to pre-twist the wires before using the connector so to ensure that the wires are indeed twisted together before applying the connector, this regardless of manufacturer instructions.

Twist-on wire connectors are available in a variety of sizes and shapes. While their exterior covering is typically an insulating plastic, their means of connection is a tapered metal coil insert, which threads onto the wires and holds them securely. When such a connector is twisted onto the stripped and twisted-together ends of wires, the wires are drawn into the connector's metal insert and squeezed together inside it. Electrical continuity is maintained by both the direct twisted wire-to-wire contact and by contact with the metal insert. Additionally, the threads cut into the wires by the tapered metal insert are what hold the twist-on wire connector onto the assembly.

Twist-on wire connectors are typically installed by hand and may have external grooves to make them easier to handle and apply. Wing-like extensions are commonly molded into higher quality connectors to reduce an installer's muscle fatigue when installing large numbers of connectors. Additional tools such as a common nut driver are also used to help reduce installer fatigue during the installation of a large numbers of such connectors. The connectors are commonly color-coded to indicate connector size and, hence, their capacity. They are commonly used as an alternative to terminal blocks or the soldering together of conductors since they are quicker to install and, unlike soldered connections, allow easy subsequent removal for future modifications. Twist-on connectors are not often used on wire gauges thicker than AWG #10 ($5.26$ $mm^2$), because these wires are too stiff to be reliably connected using this method. Instead, set screw connectors, clamps, or crimp connectors are used in these instances.

There are some specialized versions of twist-on connectors. Ceramic twist-on connectors, for example, are made for high-temperature applications, such as heating appliances. Ordinary twist-on connectors are not rated for wet use (such as outdoor exposure outdoors or underground burial). Special, gel-filled connectors are used in this circumstance.

Twist-on wire connectors are not generally recommended for use with aluminum wire. The US Consumer Product Safety Commission does not approve their use with aluminum wire, and approves only two (alternative) methods of connection. Despite this, several companies manufacture twist-on connectors which they claim are designed specifically for, and rated for, use with aluminum conductors.

Special feed through twist-on wire connectors differ from standard wire connectors in that they have an additional opening at the top of the insulated cap. This allows a single-conductor bare wire to be pushed through the hole, forming a "pigtail" section which is attached to a grounding screw. These feed-through connectors are commonly referred to as "screw-on grounding connectors." For some applications, the pigtail may be unterminated, or it may end in a pre-installed spade lug. One version (colored white) is used, for example, for splicing neutral wires in a device box, while leaving the pigtail free for connection to a receptacle, for example. Another version (colored green) is used as a grounding pigtail and is similar to the feed through twist-on wire connector previously described.

As noted above, previous twist-on connectors are comprised of a tapered coiled metal insert surrounded by an insulating material which ranges from plastic to polymers to rubber. Typically, innovation regarding twist-on connectors relates to material changes; however, the fundamental of a coil inside an insulator is basic to all of these current connector constructions. As an example, adding gels for waterproofing is a recent innovation, but the fundamental structure of a twist-on connector is the same as in earlier constructions.

The most expensive part of a basic twist-on connector is the tapered coil itself and its manufacture. The sole purpose of the coil is to twist the wires together, but in doing so, it adds to the bulkiness of the connector. Since it is the practice of electricians to pre-twist the wires anyway (again, so that they can visually see they have a good, twisted, mechanical bond), the role of the tapered coil is essentially obsolete.

BRIEF SUMMARY OF THE INVENTION

The present invention is directed to a connector system that still uses the electrician's practice of twisting wires together and using an insulating cover. Such a connector has all the attributes of a conventional "twist-on" connector including, but not limited to, special sealant filled connectors for use in wet applications. However, the connection system and connector of the present invention is less bulky, is easy to use, allows visible confirmation by an installer of the connection, and is less expensive to manufacture.

It is a feature of the present invention that it separates the action of holding a connector on the wires from the action of insulating the connection using either individual components or elements of the same component. The resulting connection has greater pull-out strength than conventional connectors, but takes up less volume. The pull-out strength is directly proportional to the amount of force required to pull the twist out of the wires, and the strength of the connection between the insulating cover and the component which slides over the wires. The end result is that the protective insulation is better attached to the connection than was previously possible. The volumetric reduction results from the connector no longer needing to house a tapered steel spring insert, nor needing to rotate freely; and, it allows a designer to use thinner material walls. As such, the shape can be more angular providing for less fill in electronics enclosures, and allowing an electrician to better "pack" the connections when compared with the circular twist-on connectors.

Other objects and features will be in part apparent and in part pointed out hereinafter.

BRIEF DESCRIPTION OF THE SEVERAL VIEWS OF THE DRAWINGS

The accompanying figures which, together with the detailed description that follows, form part of the specification and illustrate the various embodiments described in the specification.

FIG. 1 is a perspective view of an assembled compact electrical twist-on connector of the connection system of the present invention;

FIG. 2B is a top plan view of the base;

FIG. 4A is a perspective view of a cap of the connector, and FIG. 4B is a bottom plan view thereof;

FIGS. 5A and 5B illustrate assembly of the connector;

Corresponding reference characters indicate corresponding parts throughout the several views of the drawings.

DETAILED DESCRIPTION OF INVENTION

Figure 2A:
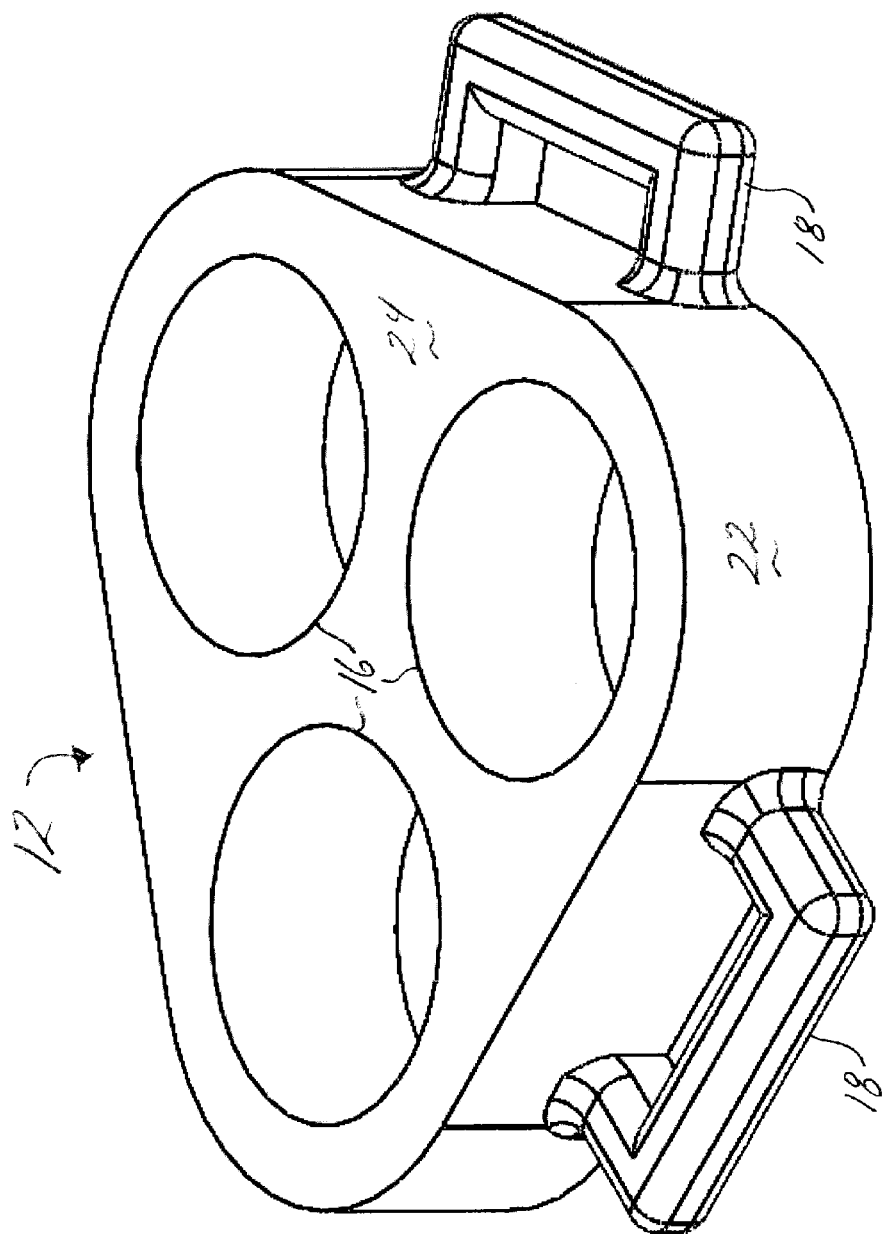
FIG. 2A is a perspective view of a base of the connector.

The following detailed description illustrates the invention by way of example and not by way of limitation. This description clearly enables one skilled in the art to make and use the invention, and describes several embodiments, adaptations, variations, alternatives and uses of the invention, including what is presently believed to be the best mode of carrying out the invention. Additionally, it is to be understood that the invention is not limited in its application to the details of construction and the arrangement of components set forth in the following description or illustrated in the drawings. The invention is capable of other embodiments and of being practiced or carried out in various ways. Also, it will be understood that the phraseology and terminology used herein is for the purpose of description and should not be regarded as limiting.

Referring to the drawings, a compact electrical connector for a connection system is indicated generally 10. Connector 10 is used to mechanically secure the exposed ends E (see FIGS. 5B and 6) of shielded electrical wires W. The exposed ends of the wires are twisted together and housed within a shell formed by the connector so to be securely enclosed within the connector. Further, connector 10 is significantly smaller in size than conventional connectors currently in use by electricians for securing together the exposed outer ends of electrical wires. While connector 10, as shown and described herein, is for use with a three (3) wire configuration, it will be understood by those skilled in the art that other embodiments of the connector can be used, for example, with a two (2) wire installation without departing from the scope of the invention.

As shown in the drawings, and as described herein, connector 10 comprises two components, a base generally indicated 12, and a cap generally indicated 14 which fits over, and interlocks with, base 12. Both components 12 and 14 are made of a lightweight, electrically non-conductive molded plastic material. With regard to base 12, it could be planar in form so to be fabricated by a stamping process. This could further lower the cost of the connector's manufacture.

Figure 6:
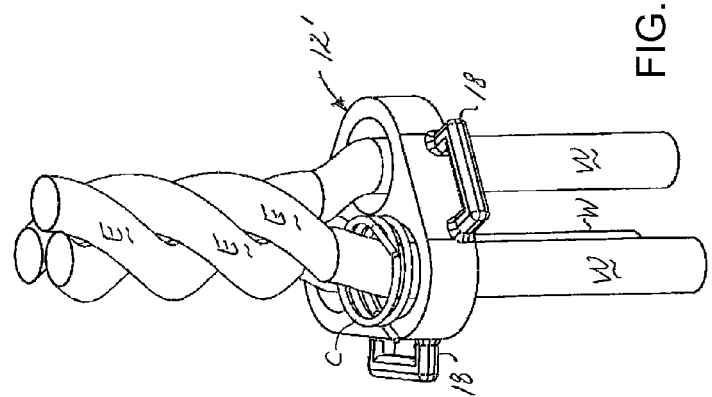
FIG. 6 is a view similar to FIG. 5B illustrating but with the base including the current sensing coil; and, FIG. 7 is a block diagram for reporting operational information about the connecting system.

Referring to FIGS. 2A and 2B, in one embodiment base 12 is shown to be generally triangular in plan with each corner of the base being rounded. Within base 12 are three individual openings or ports 16 through which the ends of wires W are inserted as shown in FIGS. 5A, 5B, and 6. Extending outwardly from each side of base 12, adjacent the bottom of the base, is a generally U-shaped, when viewed in plan, bracket 18. An attachment arm 20 of cap 14 is inserted through the open area defined by bracket 18 and a sidewall 22 of base 14 to capture the cap and hold it in place when connector 10 is assembled as shown in FIG. 1.

It will be understood by those skilled in the art that an electrically non-conductive gasket or sealing material can be placed over, or applied to, an upper surface or inner face 24 of base 12. For example, a non-conductive sealant material such as silicone is appropriate for waterproofing purposes. Also, base 12 could be modified to prevent any such material from flowing or being squeezed out of connector 10 as the connection system is assembled.

In another embodiment of the invention, a base 12' shown in FIG. 2B is manufactured with its ports 16 having a membrane M that seals the port until punctured by the end of a wire W being inserted through the opening forming the port. This then allows electricians to make use of connectors 10 having more ports than wires used in an installation without having to manually cover unused ports in some way. This, for example, allows a three-port connector 10 to be readily used in a two wire installation.

Figure 3:
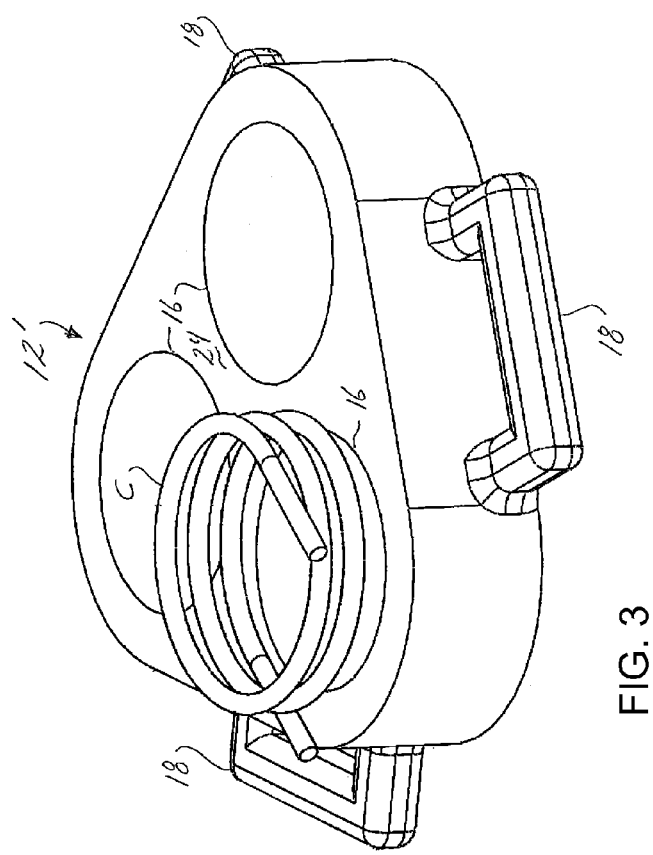
FIG. 3 is a perspective view similar to FIG. 2A and including a coil for sensing current flow through a wire installed in the base of the connector.

Referring to FIG. 3, in another embodiment of the invention, an electrical coil C is installed on the inner surface of base 12 about one of the ports 16. Coil C is a sensor coil in which an AC current is induced when electricity flows through the wires. The output from coil C is an AC current proportional to the induced voltage. As shown in FIG. 6, coil C surrounds the wire W inserted through this port.

Cap 14, as shown in FIGS. 4A and 4B, creates an electrically insulated internal volume in which the exposed ends E of twisted wires W are enclosed. Cap 14 keeps outside elements (water, dirt, debris, etc.) from getting into connector 10 and coming into direct contact with the exposed ends E of the wires installed in the connector.

Cap 14 comprises an elongate, triangular shaped, hollow cap whose outer contour, at a bottom surface 26 of the cap, see FIG. 4B, corresponds in size and shape to upper surface 24 of base 12. This enables the respective ends of the cap and base to align and register with each other without any overlap between them. Respective attachment arms 20 extend vertically from each side of cap 14 with the lower end of each arm extending below the bottom of the cap a sufficient distance to be received in an associated bracket 18 of base 12. The distal end 28 of each arm 20 forms a latch so as the arm is inserted through the bracket, the latch portion of the arm is captured on (snap fits with) the underside of the bracket. This firmly locks the cap and base together.

Referring to FIGS. 5A and 5B, assembly of the connection system is as follows:

First, the outer ends of wires W are inserted through openings 16 in base 12, the ends of the wires being inserted through the base from the underside of the base. This is as shown in FIG. 5A.

Next, the outer ends of the wires are stripped of their insulation to create exposed outer ends E.

Then, the exposed ends of the wires are twisted together as shown in FIG. 5B.

Finally, cap 14 is aligned with base 12 and then lowered onto the base with the arms 20 being inserted through the brackets 18 until the latch portions of the arms are captured by the brackets 18 of base 12.

Since the stripped portions of wires W are housed within connector system 10, cap 14 provides, together with base 12, effectively insulates the conductive elements (wires W) enclosed within the connector from exterior elements. Although not shown, an electrically non-conductive sealant material may be poured or injected into cap 14 to, for example, waterproof the connection. Additionally, since the wires W enter base 12 through individual ports 16, any excess sealant will surround and encapsulate the portion of the wires adjacent the base, so that a sealant need not be manually applied the connection system after completion of the assembly.

Figure 7:
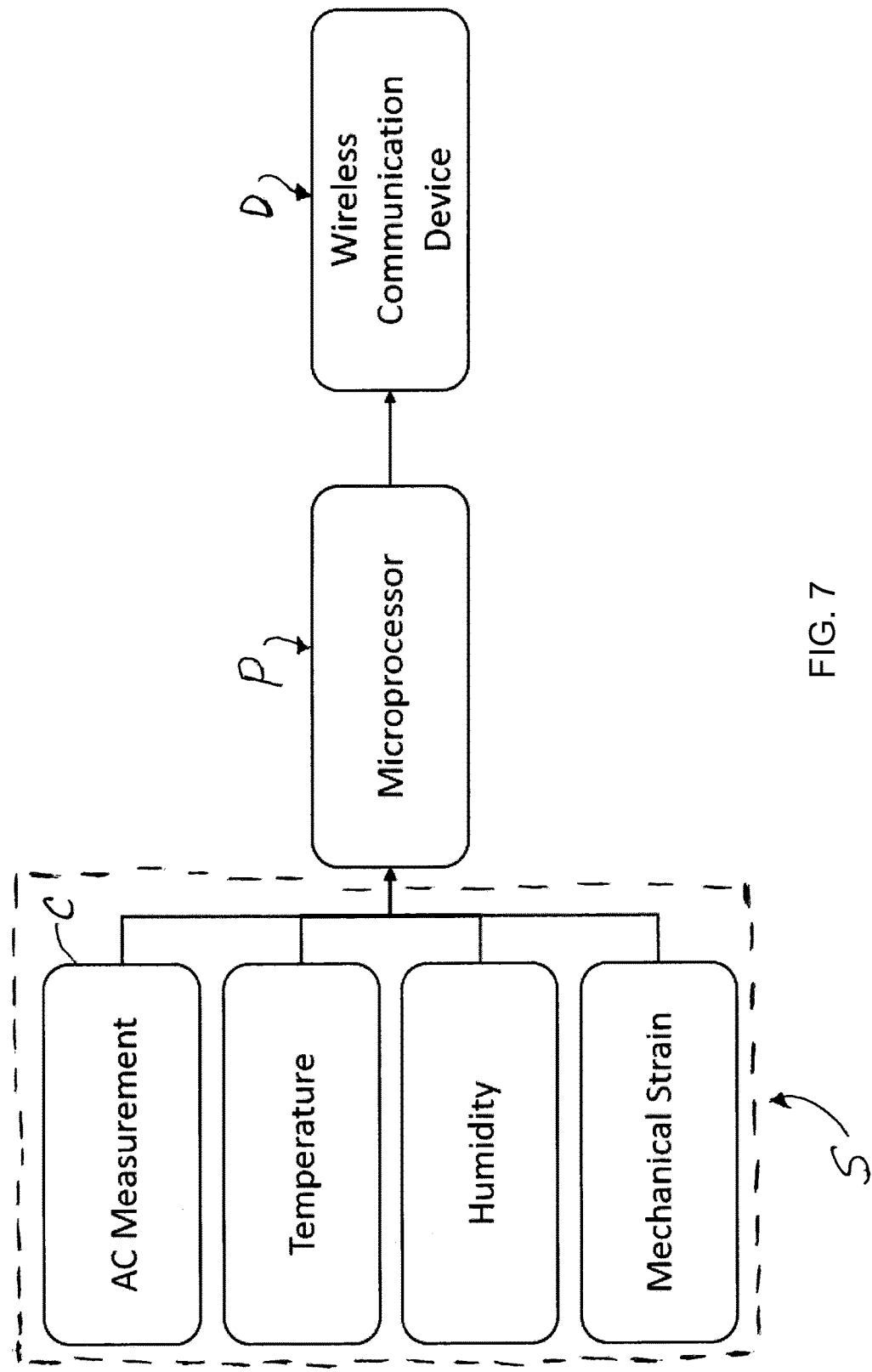

Referring to FIGS. 6, and 7, connection system 10, in one embodiment, comprises part of a sensor package S for reporting the status of the installation in which connector 10 is used. That is, when AC flows through the wires, an AC current is induced in coil C and the output from the coil is a level proportional to the induced current. This information is provided to a microprocessor P as indicated in FIG. 7. Other information is provided by the sensor package to the microprocessor includes one or more of:

a. temperature
b. humidity
c. system integrity (e.g. strain on the connector)

Outputs from the microprocessor are provided, for example, to a wireless communications device D such as a cell phone for transmission to a remote site where the status of the installation is monitored.

In view of the above, it will be seen that the several objects and advantages of the present disclosure have been achieved and other advantageous results have been obtained.

Having thus described the invention, what is claimed and desired to be secured by Letters Patent is:

1. An electrical connection system for securely connecting at least three electrical wires together comprising:
a generally triangularly shaped, in cross-section, non-electrically conductive base having at least three ports formed therein corresponding to at least the number of wires being connected together, an end of each wire to be connected together being inserted through a respective one of the ports;
a non-electrically conductive cap sized and similarly triangularly shaped, in cross-section, to the base to align with and fit over a top of the base, the cap being fitted over the base after an end of each wire inserted through the base is exposed and the exposed ends of the wires are twisted together, the exposed ends of the twisted together wires fitting within the cap after the cap is fitted over the base with abutting surfaces of the base and cap aligning with and being in registry with each other after the base and cap are fitted together;
a locking bracket formed along each side of the base and cap for interlocking the base and cap together so to form a shell in which the wires are interconnected and securely enclosed; and,
an arm extending from each side of the cap and extending a length sufficiently beyond a bottom of the cap for a distal end of each arm to be received in an associated bracket formed in the base.

2. The system of claim 1 in which individual ports formed in the base are sealed until punctured by an end of a wire inserted through an opening defined by the port.

3. The system of claim 1 in which the distal end of each arm comprises a latch so for the distal end of each arm to be captured in an associated bracket formed on the same side of the base as the side of the cap from which the arm extends to interlock the cap and base together.

4. The system of claim 1 further including a non-conductive sealant material on the interior of the cap to waterproof the electrical connection of the wires.

5. The system of claim 1 in which the base is a planar base formed by a stamping.

6. The system of claim 1 further including a sensor for sensing an AC current flowing through the twisted together wires.

7. The system of claim 6 in which the sensor comprises an electrical coil fitted about one of the ports so to surround the wire inserted through that port with voltage flowing through the wire inducing an AC current in the coil representative of the AC current in the wire.

8. The system of claim 7 further including a sensor package for providing information about the status of the system including one or more of the temperature, humidity and the strain on the wires housed in a shell formed by the base and cap.

9. The system of claim 8 further including a microprocessor to which sensor outputs from the sensor package are provided.

10. The system of claim 9 further including a wireless communications device to which outputs from the microprocessor are provided for transmission to a remote site where the status of the system is monitored.

11. A method for securely connecting at least three electrical wires together in an electrical connection system comprising:
inserting each wire through a separate port formed in a generally triangularly shaped, in cross-section, non-electrically conductive base having a plurality of ports formed therein, the number of ports corresponding to at least the number of wires being connected together;
exposing the outer ends of each wire and twisting the exposed outer ends of the wires together after all the wires have been inserted through their respective ports;
fitting a non-electrically conductive cap sized and similarly triangularly shaped, in cross-section, to the base to align with the base over a top of the base, the exposed ends of the interconnected wires fitting within the cap with abutting surfaces of the base and cap being in registry with each other after being fitted together; and,
interlocking the base and cap together so to form a shell in which the wires are interconnected and securely enclosed, the cap having an arm extending from each side thereof, each arm extending a length sufficiently beyond a bottom of the cap for a distal end of each arm to be received in an associated bracket formed in the base so to interlock the base and cap together.

12. The method of claim 11 further including sealing each port formed in the base with the seal being broken only when an outer end of a wire is inserted through an opening defined by the port.

13. The method of claim 11 further including for sensing an AC current flowing through the twisted together wires.

14. The method of claim 13 in which sensing the AC current flowing through the twisted together wires includes fitting an electrical coil fitted about one of the ports so to surround the wire inserted through that port with electricity flowing through wire inducing a current in the coil representative of the AC current in the wire.

15. The method of claim 14 further comprising providing information about the status of the system including one or more of the temperature, humidity and the strain on the wires housed in a shell formed by the base and cap.

16. The method of claim 15 further including a microprocessor to which the information about the system is provided.

17. The method of claim 16 further including providing outputs from the microprocessor to a wireless communications device for transmission to a remote site where the status of the system is monitored.

18. The method of claim 11 further including waterproofing a connector formed by the base and the cap.

* * * * *

UNITED STATES PATENT AND TRADEMARK OFFICE
CERTIFICATE OF CORRECTION

PATENT NO. : 9,620,868 B2  
APPLICATION NO. : 14/524003  
DATED : April 11, 2017  
INVENTOR(S) : Matthew Wootton Page 1 of 1

It is certified that error appears in the above-identified patent and that said Letters Patent is hereby corrected as shown below:

On the Title Page

Please insert --(73) Assignee: Wootton Enterprises, LLC, O'Fallon, MO (US)--.

Signed and Sealed this  
Twenty-sixth Day of December, 2017

Joseph Matal  
*Performing the Functions and Duties of the*  
*Under Secretary of Commerce for Intellectual Property and*  
*Director of the United States Patent and Trademark Office*